United States Patent
Lin et al.

(10) Patent No.: US 9,196,491 B2
(45) Date of Patent: *Nov. 24, 2015

(54) END-CUT FIRST APPROACH FOR CRITICAL DIMENSION CONTROL

(71) Applicant: Taiwan Semiconductor Manufacturing Company, Ltd., Hsin-Chu (TW)

(72) Inventors: Li-Te S. Lin, Hsinchu (TW); Meng Jun Wang, Qingshui Township (TW); Ya Hui Chang, Hsinchu (TW); Hui Ouyang, Chubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/059,898

(22) Filed: Oct. 22, 2013

(65) Prior Publication Data
US 2014/0106479 A1    Apr. 17, 2014

Related U.S. Application Data

(63) Continuation of application No. 12/625,957, filed on Nov. 25, 2009, now Pat. No. 8,563,410.

(51) Int. Cl.
| | |
|---|---|
| *H01L 21/66* | (2006.01) |
| *H01L 21/3205* | (2006.01) |
| *H01L 21/28* | (2006.01) |
| *H01L 21/3213* | (2006.01) |

(52) U.S. Cl.
CPC .... *H01L 21/28026* (2013.01); *H01L 21/28008* (2013.01); *H01L 21/28123* (2013.01); *H01L 21/32139* (2013.01); *H01L 22/12* (2013.01); *H01L 22/20* (2013.01); *H01L 2924/0002* (2013.01)

(58) Field of Classification Search
CPC ............... H01L 21/28008; H01L 21/28026; H01L 21/28123; H01L 21/32139; H01L 22/12; H01L 22/20
USPC .......................... 438/585, 587, 671, 313, 14; 257/E21.267
See application file for complete search history.

(56) References Cited

U.S. PATENT DOCUMENTS

| | | | | |
|---|---|---|---|---|
| 8,048,764 | B2 * | 11/2011 | Huang et al. | 438/425 |
| 8,563,410 | B2 * | 10/2013 | Lin et al. | 438/585 |
| 2002/0059557 | A1 * | 5/2002 | Shin et al. | 716/19 |
| 2004/0157169 | A1 * | 8/2004 | Morioka | 430/325 |
| 2008/0164526 | A1 * | 7/2008 | Wang et al. | 257/352 |
| 2008/0286698 | A1 * | 11/2008 | Zhuang et al. | 430/323 |
| 2009/0081882 | A1 * | 3/2009 | Setta | 438/761 |
| 2010/0203717 | A1 * | 8/2010 | Kanakasabapathy et al. | 438/592 |

* cited by examiner

*Primary Examiner* — Michael Trinh
(74) *Attorney, Agent, or Firm* — Haynes and Boone, LLP

(57) ABSTRACT

A method for fabricating a semiconductor device is disclosed. The method includes forming at least one material layer over a substrate; performing an end-cut patterning process to form an end-cut pattern overlying the at least one material layer; transferring the end-cut pattern to the at least one material layer; performing a line-cut patterning process after the end-cut patterning process to form a line-cut pattern overlying the at least one material layer; and transferring the line-cut pattern to the at least one material layer.

20 Claims, 17 Drawing Sheets

END-CUT FIRST APPROACH FOR CRITICAL DIMENSION CONTROL

PRIORITY DATA

The present application is a continuation of U.S. Ser. No. 12/625,957 filed on Nov. 25, 2009, entitled "END-CUT FIRST APPROACH FOR CRITICAL DIMENSION CONTROL," now U.S. Pat. No. 8,563,410, the entire disclosure of which is incorporated herein by reference in its entirety.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

IC processing often utilizes a series of patterning processes to produce a plurality of IC features. Conventional processing utilizes a double patterning technique for patterning gate structures, which involves a line-cut first approach. For example, when patterning a plurality of features, a line-cut patterning process is performed, and then, an end-cut patterning process is performed. In logic areas (or static random access memory (SRAM) areas), the line-cut patterning process can form a poly gate, and the end-cut patterning process can provide poly line-end spacing control. It has been observed that the line-cut first approach provides less than desirable critical dimension uniformity. Particularly, the line-cut first approach can not guarantee on-target critical dimensions. It has been further observed that conventional patterning schemes that utilize an amorphous carbon patterning layer can sometimes lead to gate oxide punch-thru issues The present disclosure proposes an end-cut first approach, which can provide improved, direct critical dimension control during subsequent line-cut patterning processes, ensuring on-target critical dimension delivery.

Accordingly, what is needed is a method for fabricating an IC device that addresses the above stated issues.

SUMMARY

The present disclosure provides for many different embodiments. A method for fabricating a semiconductor device is provided. The methods described herein can be utilized for patterning various features, including gate patterning, metal line patterning, active layer (OD layer) patterning, and other suitable feature/layer patterning. In one embodiment, the method includes forming at least one material layer over a substrate; performing an end-cut patterning process to form an end-cut pattern overlying the at least one material layer; transferring the end-cut pattern to the at least one material layer; performing a line-cut patterning process after the end-cut patterning process to form a line-cut pattern overlying the at least one material layer; and transferring the line-cut pattern to the at least one material layer.

In one embodiment, the method for fabricating a semiconductor device comprises providing a substrate having at least one material layer disposed thereover. The method continues by forming a hard mask layer over the at least one material layer; forming a first imaging layer over the hard mask layer; patterning the first imaging layer to define an end-cut pattern; and transferring the end-cut pattern to the hard mask layer. The method further continues by forming a second imaging layer over the end-cut patterned hard mask layer; patterning the second imaging layer to define a line-cut pattern; transferring the line-cut pattern to the end-cut patterned hard mask layer; and transferring the end-cut/line-cut pattern of the hard mask layer to the at least one material layer.

In one embodiment, the method for fabricating a semiconductor device includes providing a substrate having at least one material layer disposed thereover and forming a hard mask layer over the at least one material layer. The method further comprises performing a first tri-layer patterning technique to form an end-cut pattern in the hard mask layer; performing a second tri-layer patterning technique to form a line-cut pattern in the hard mask layer; and transferring the resulting end-cut/line-cut pattern of the hard mask layer to the at least one material layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
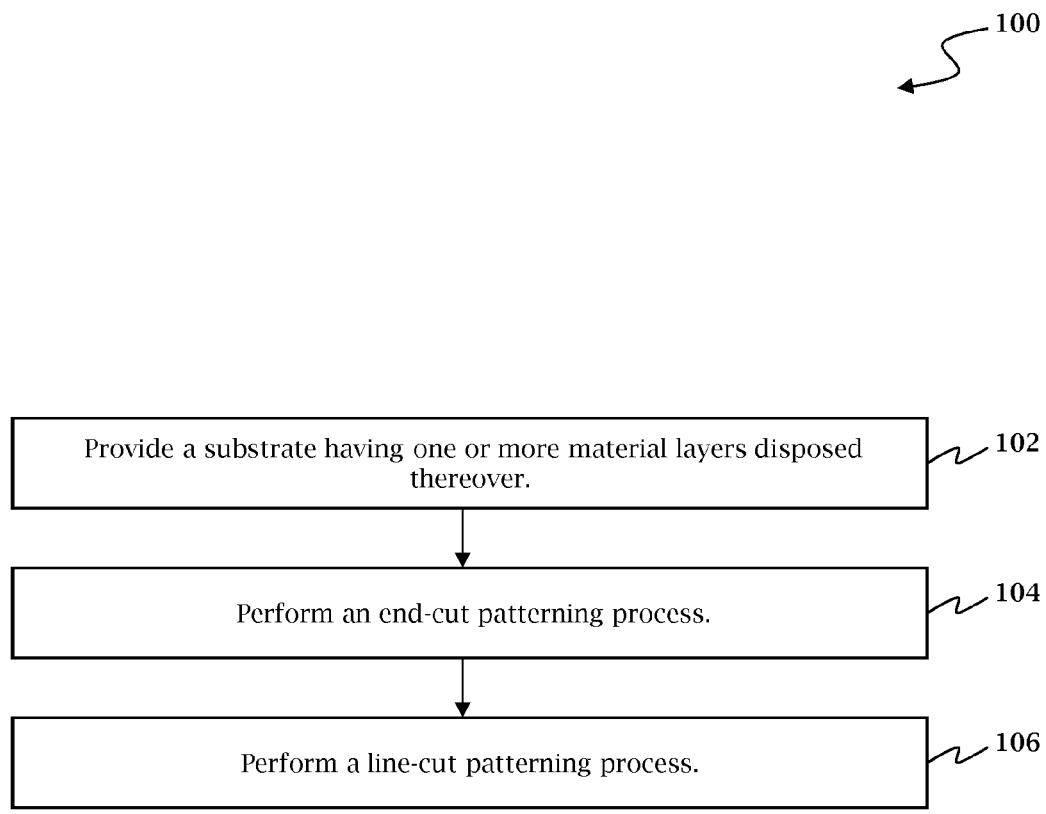
FIG. 1 is a flow chart of a method for fabricating a semiconductor device according to aspects of the present embodiments.

The present disclosure relates generally to a method for manufacturing semiconductor devices, and more particularly, to a method of patterning that forms various semiconductor device features.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
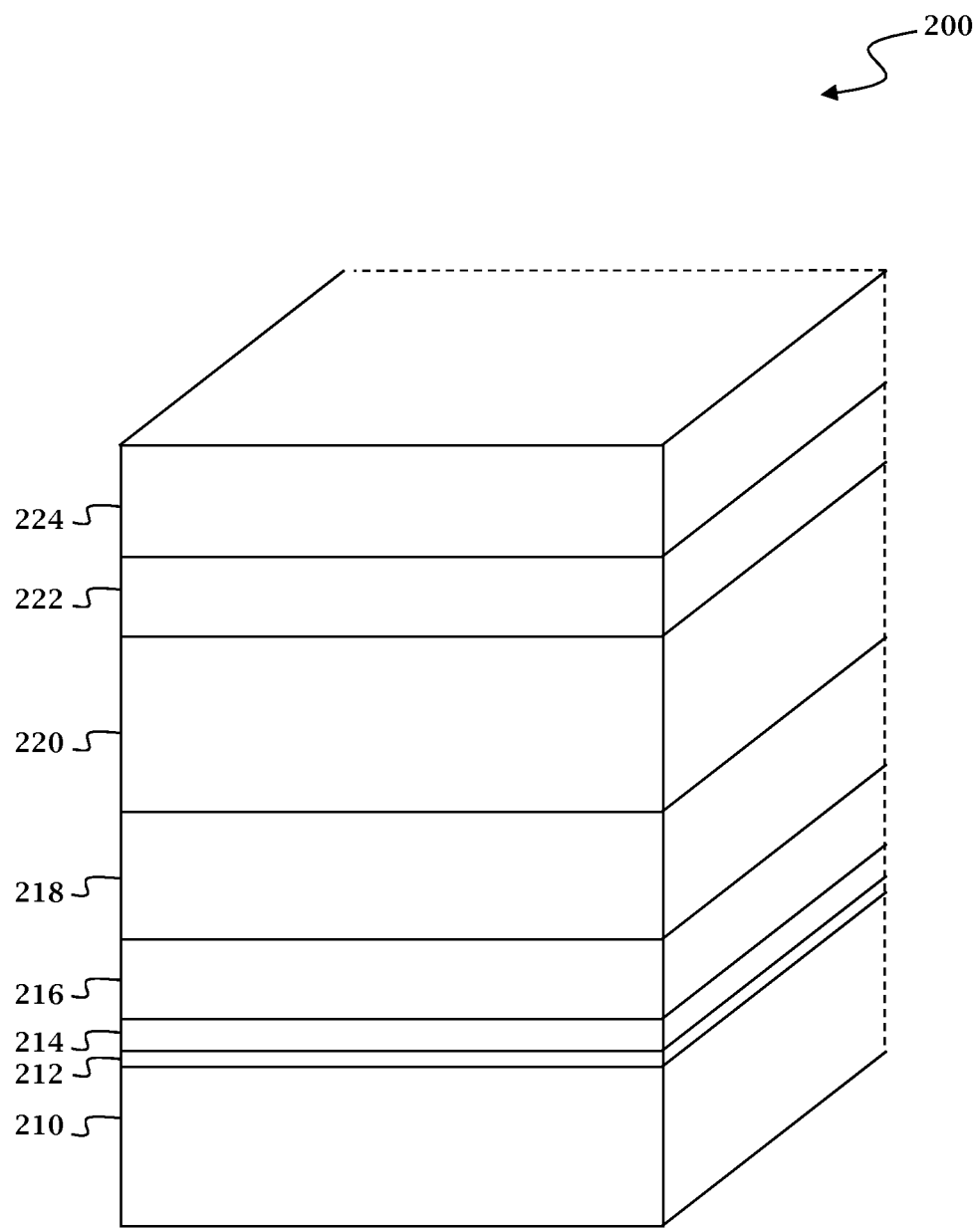
FIGS. 2A-2N are various cross-sectional views of embodiments of a semiconductor device during various fabrication stages according to the method of FIG. 1.
Figure 2B:
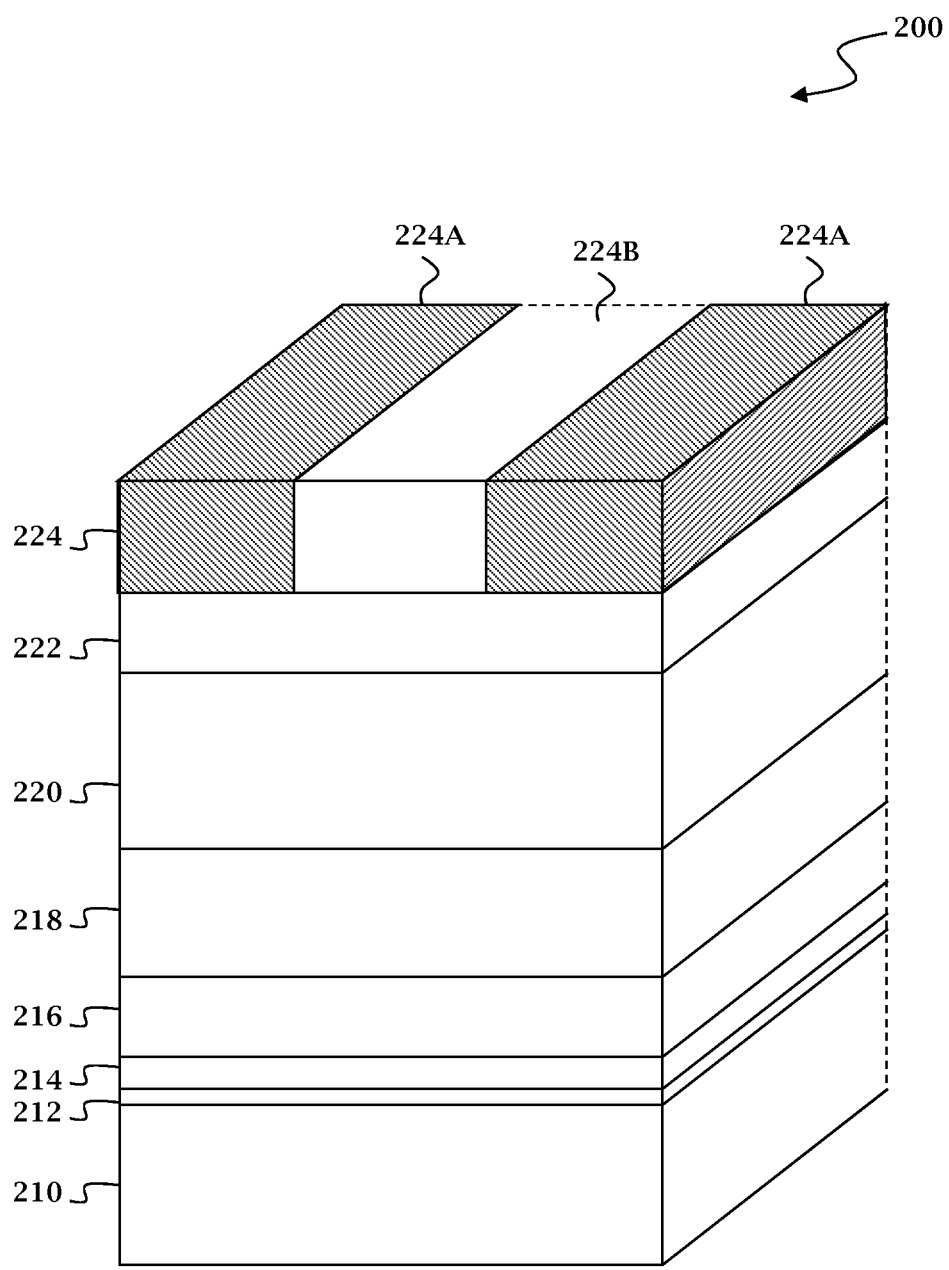
Figure 2C:
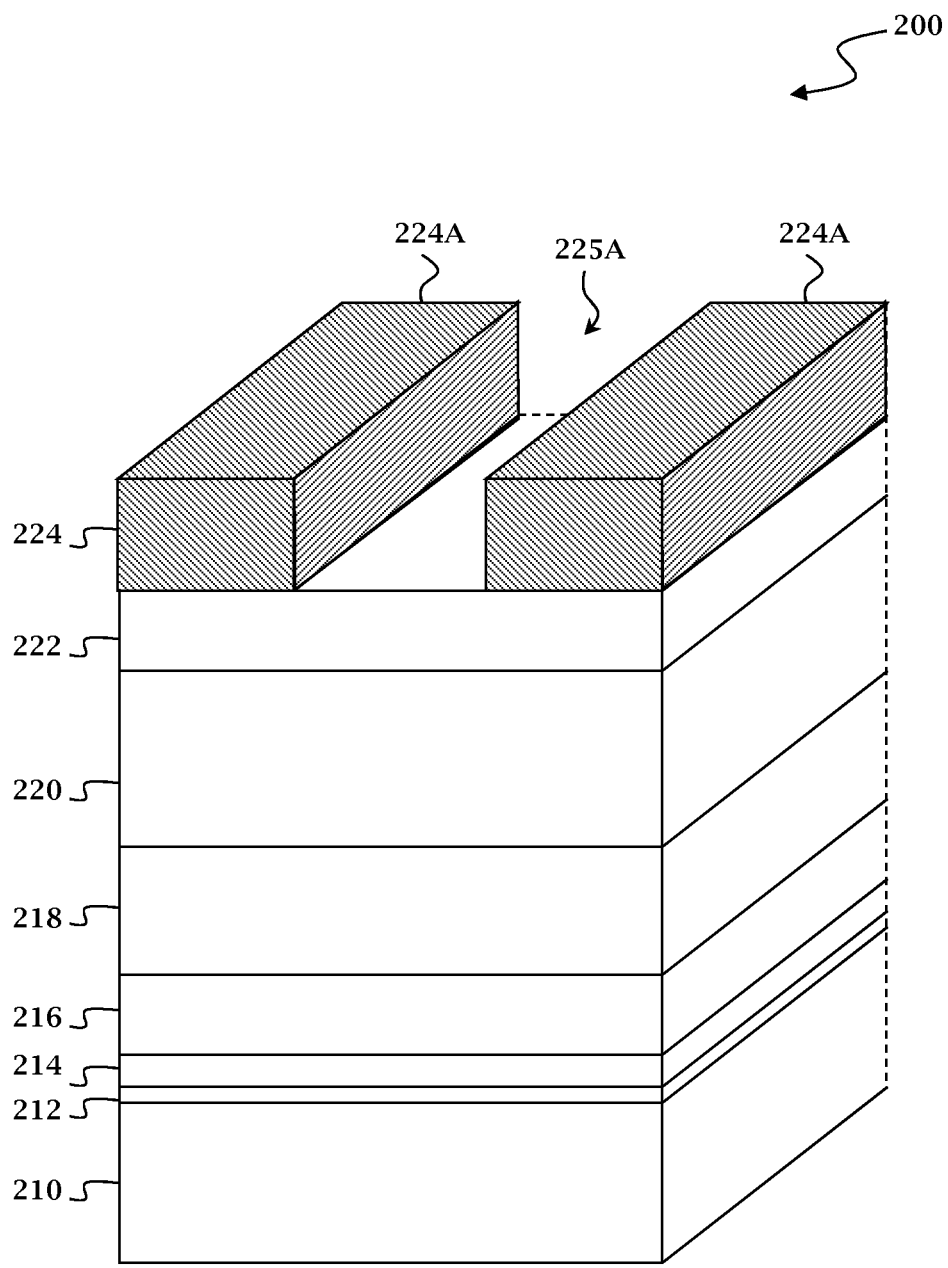
Figure 2D:
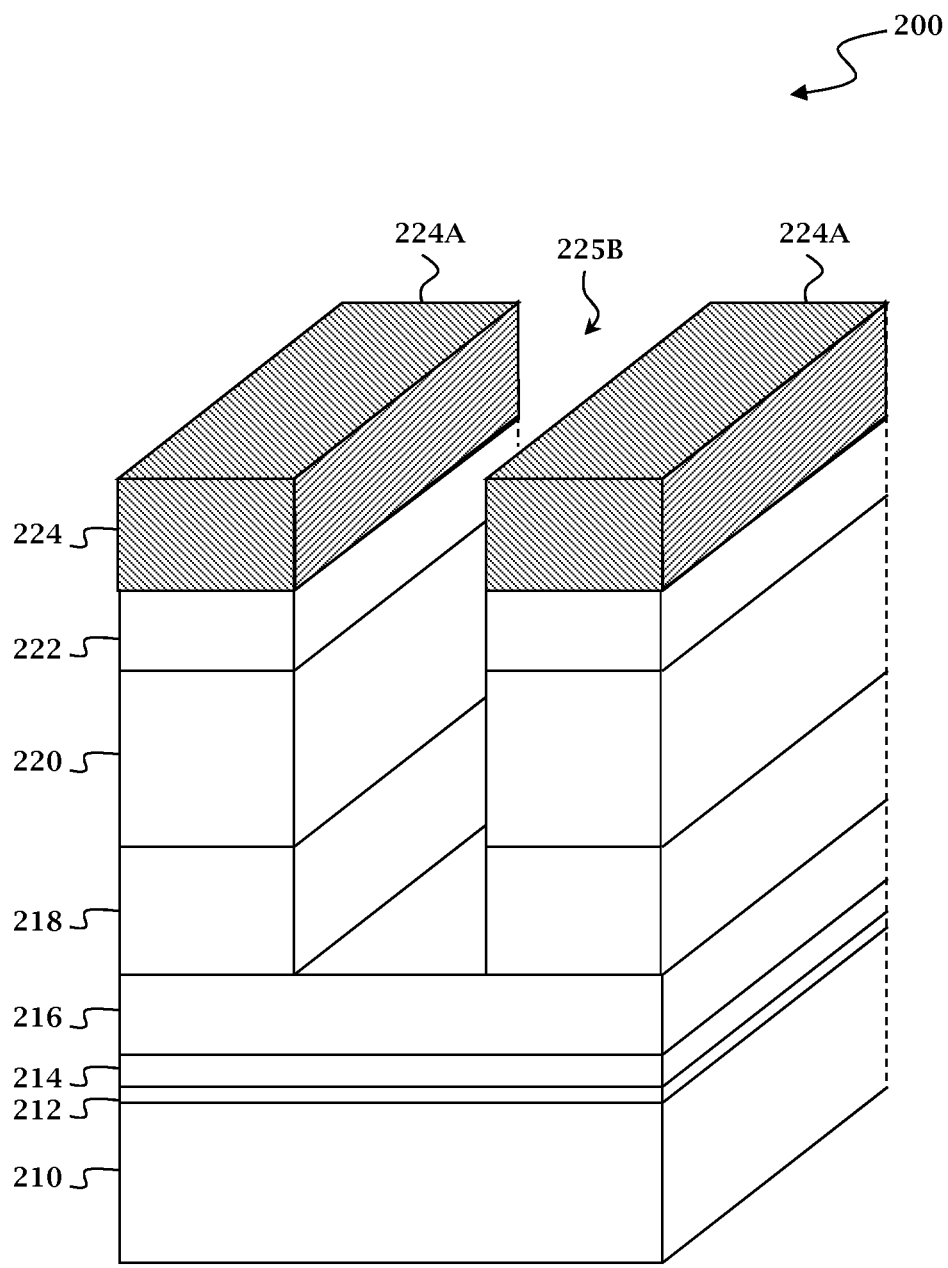
Figure 2E:
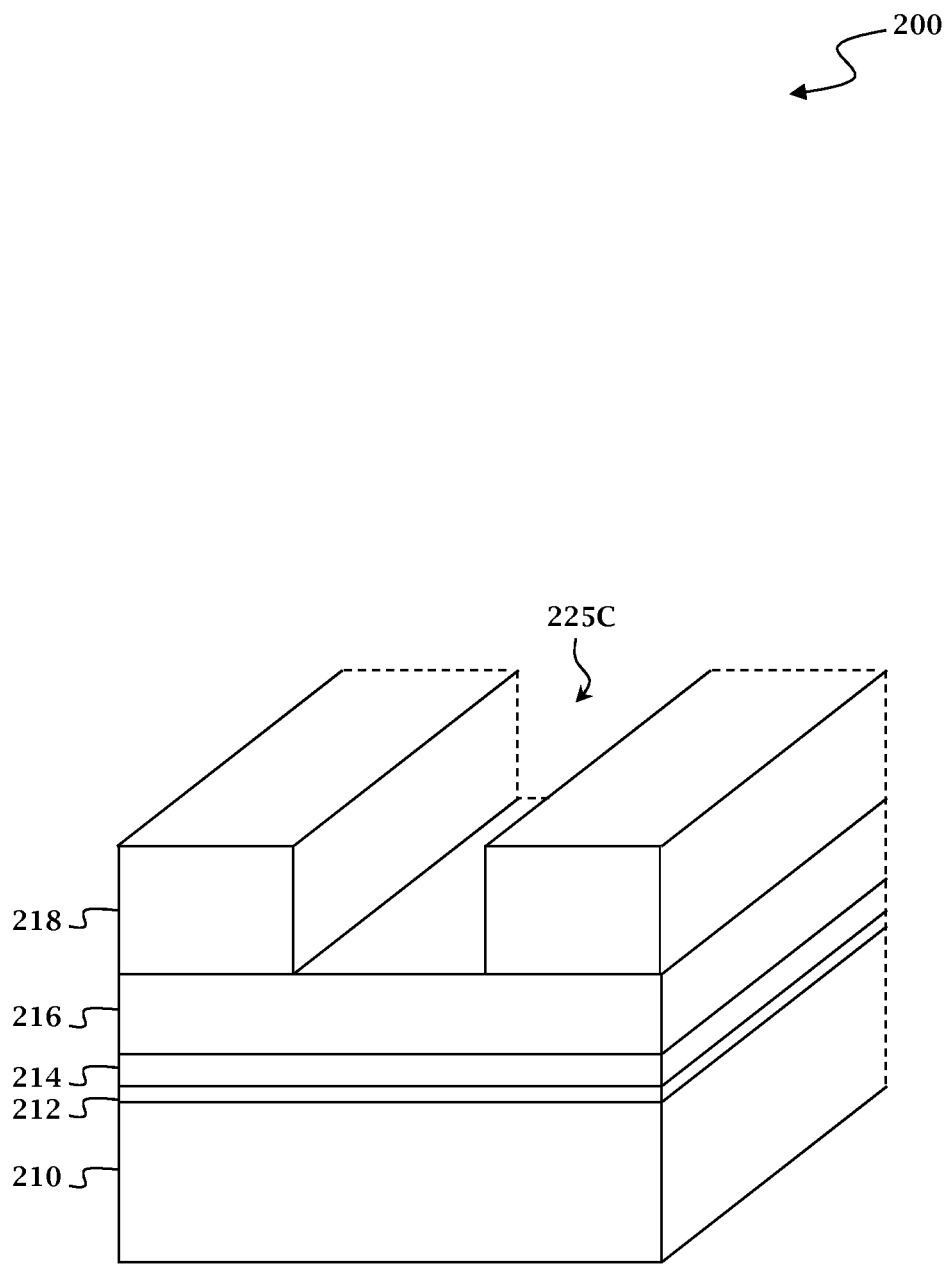
Figure 2F:
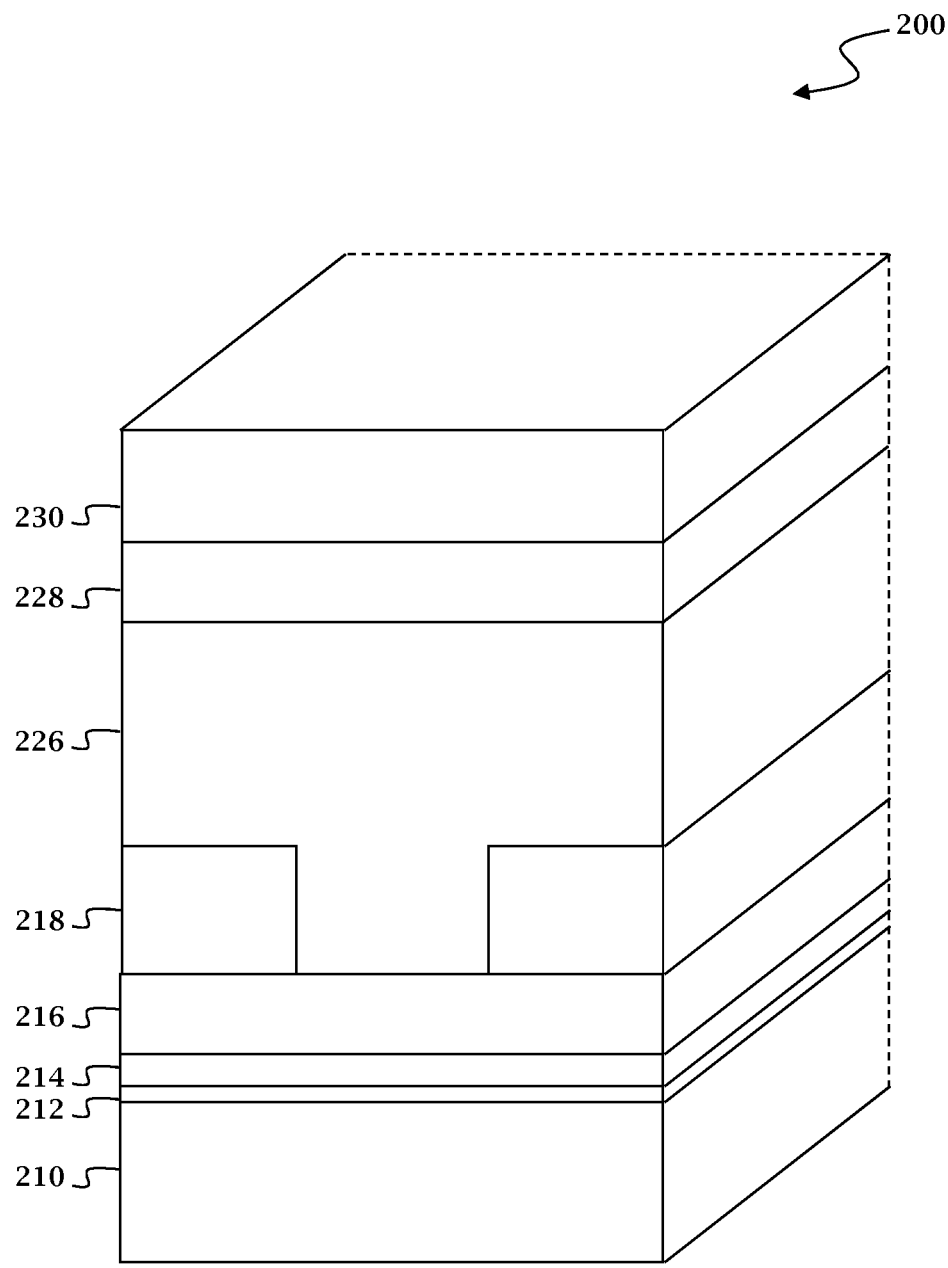
Figure 2G:
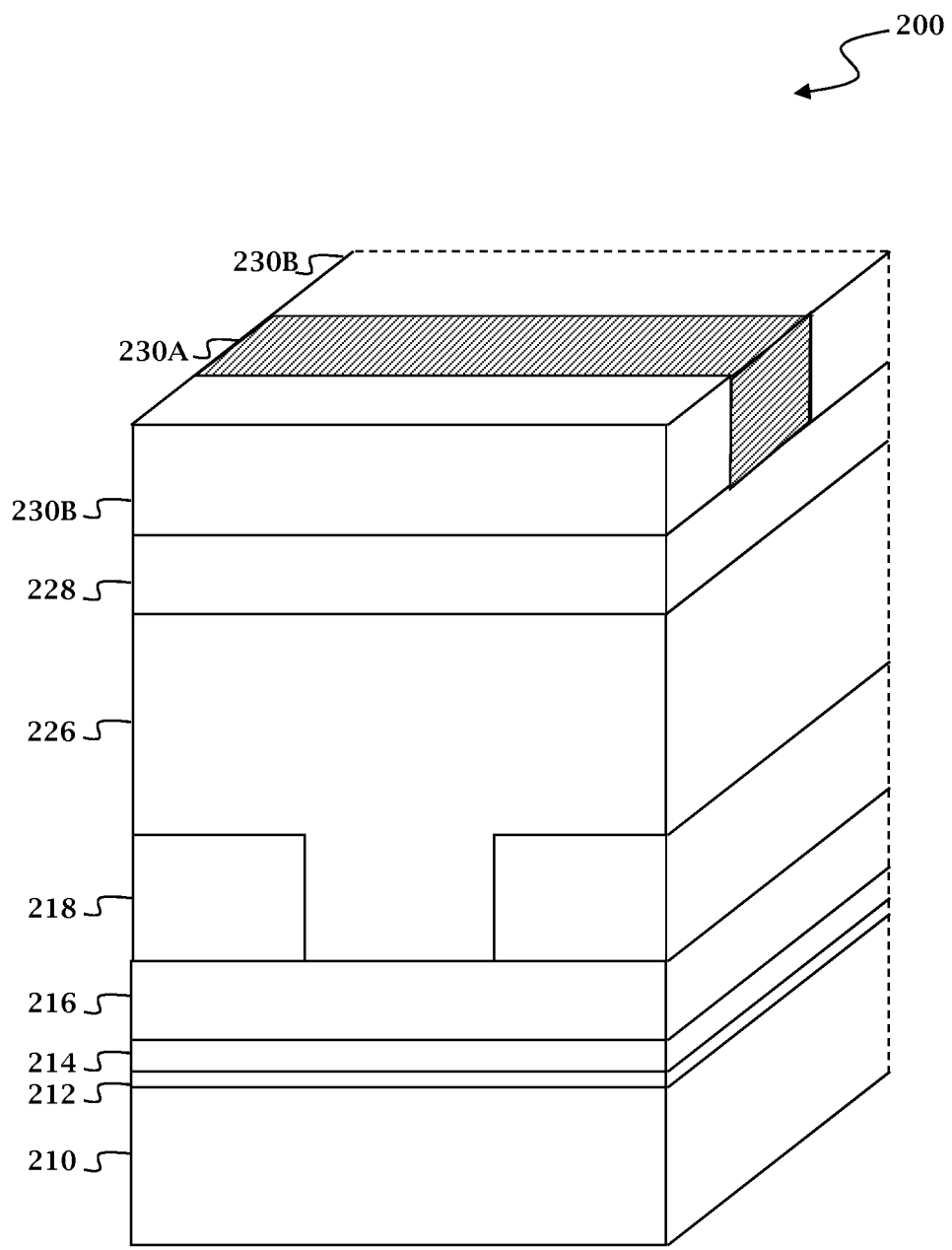
Figure 2H:
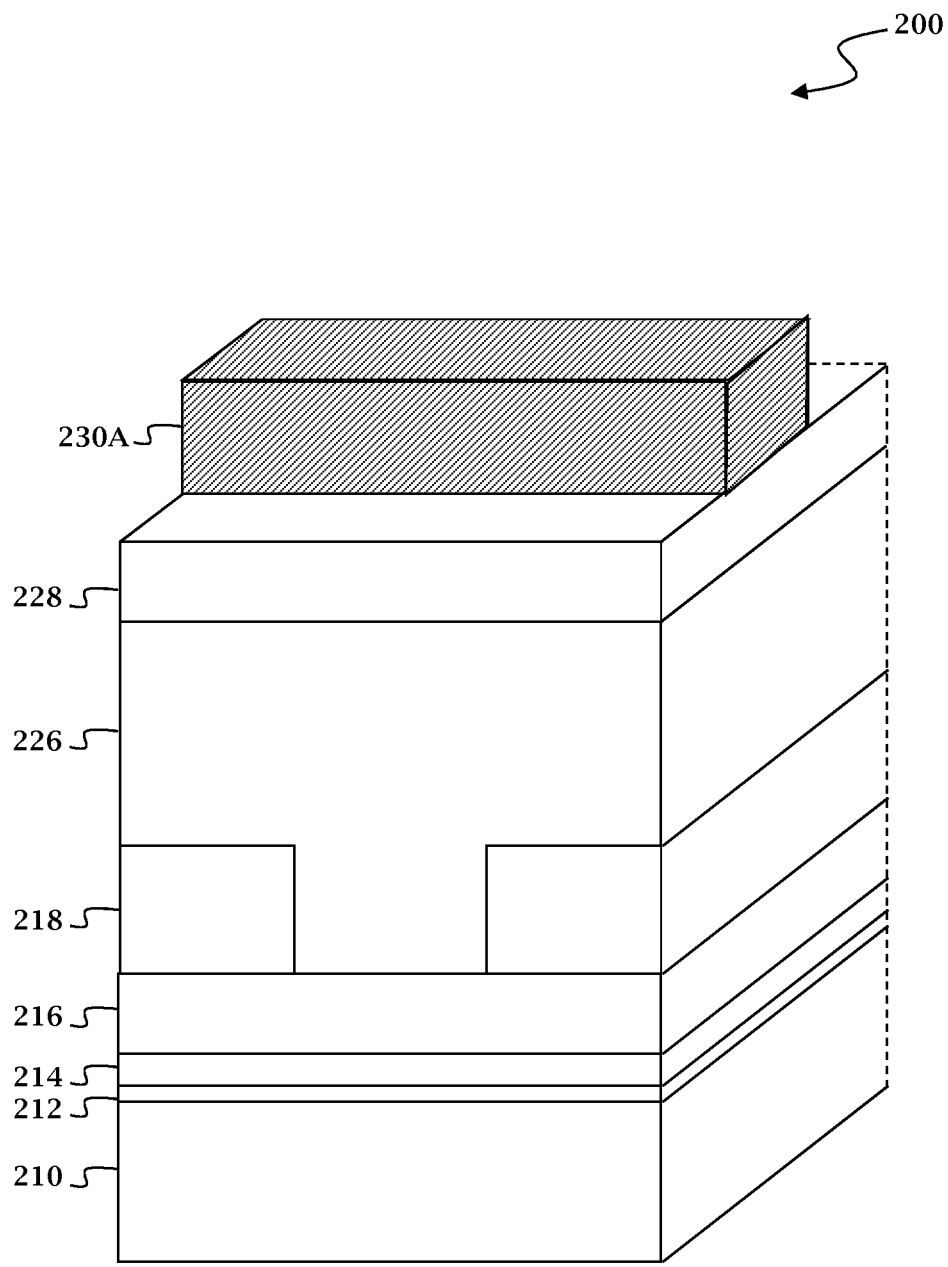
Figure 2I:
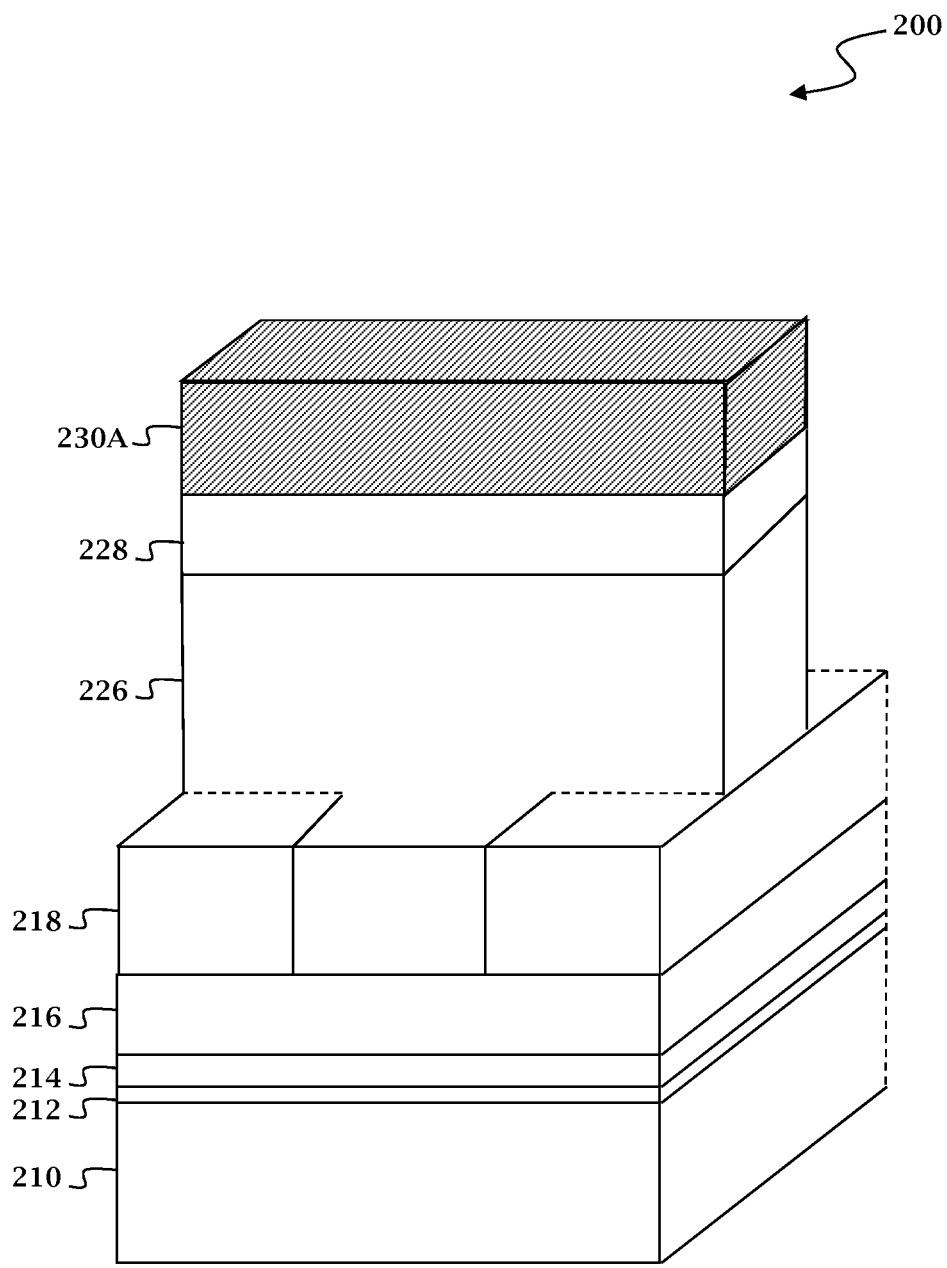
Figure 2J:
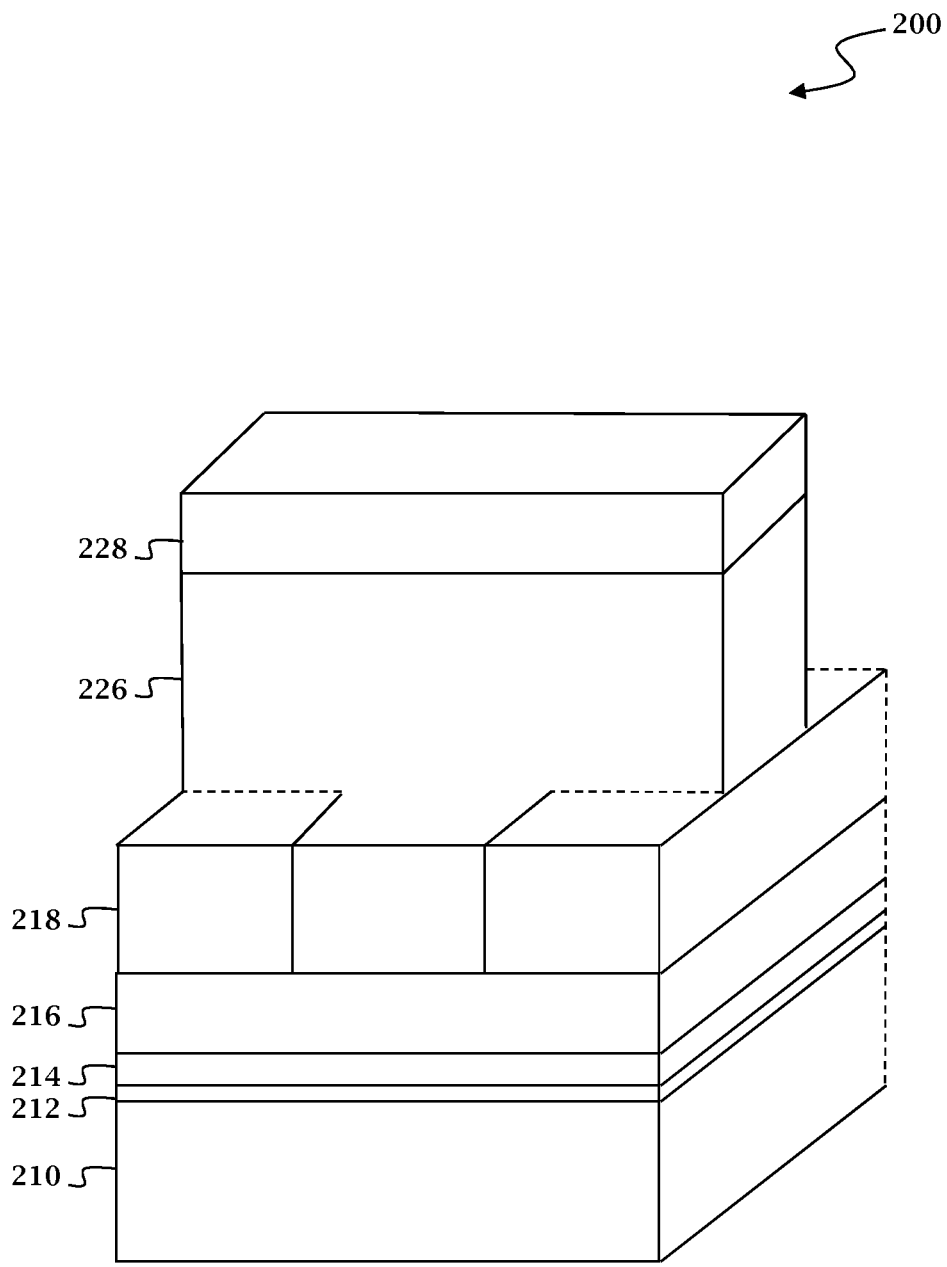
Figure 2K:
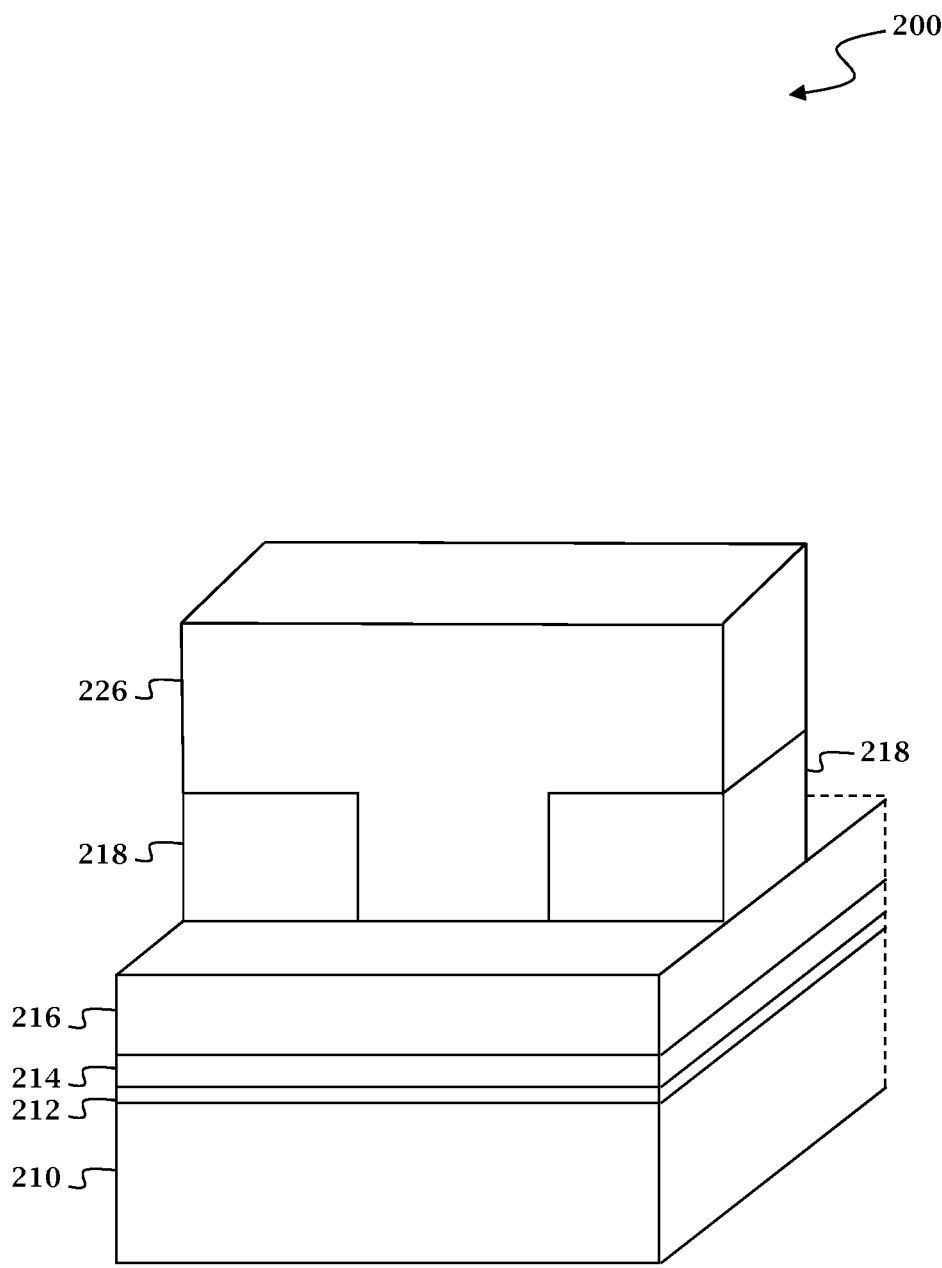
Figure 2L:
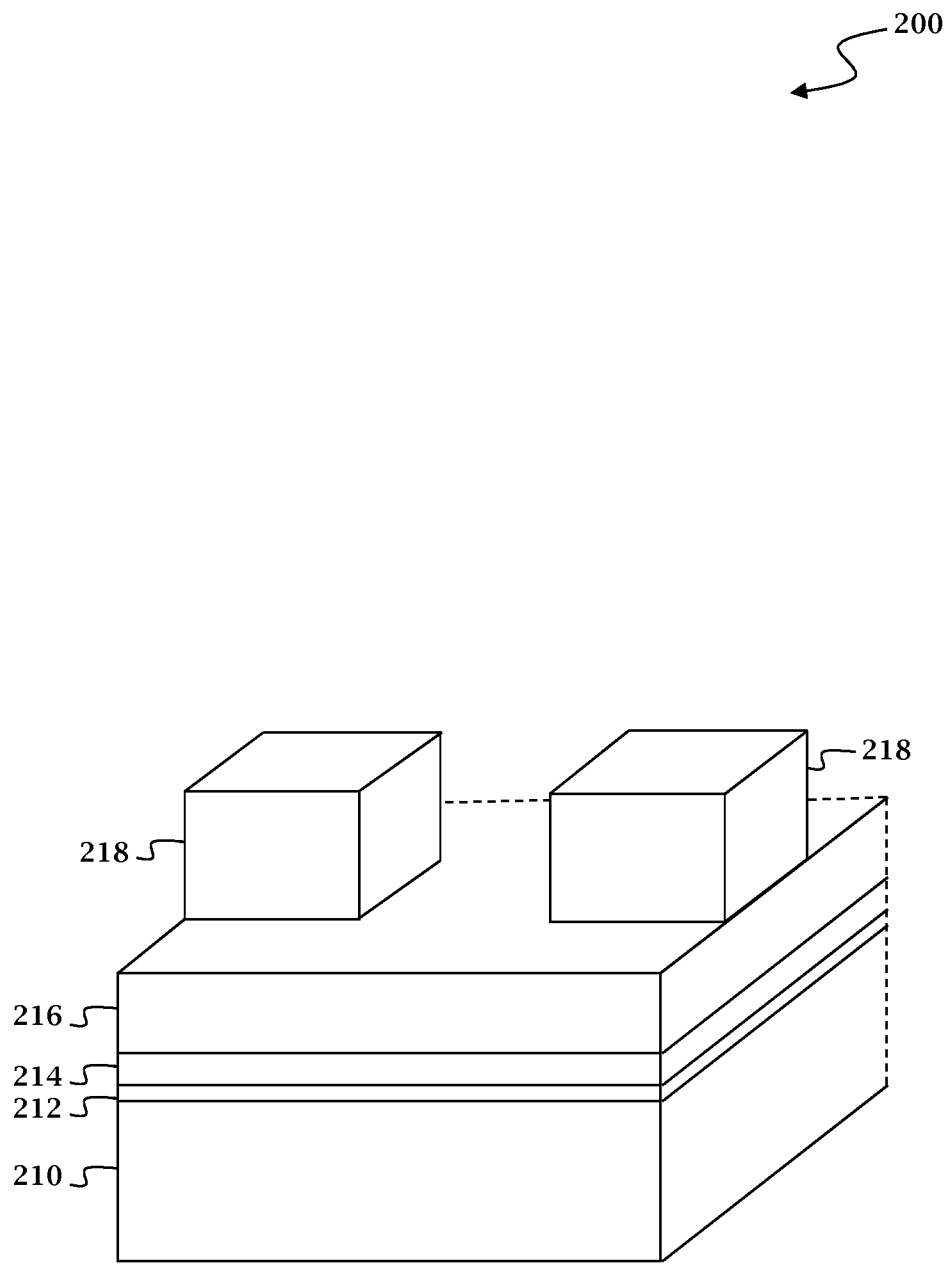
Figure 2M:
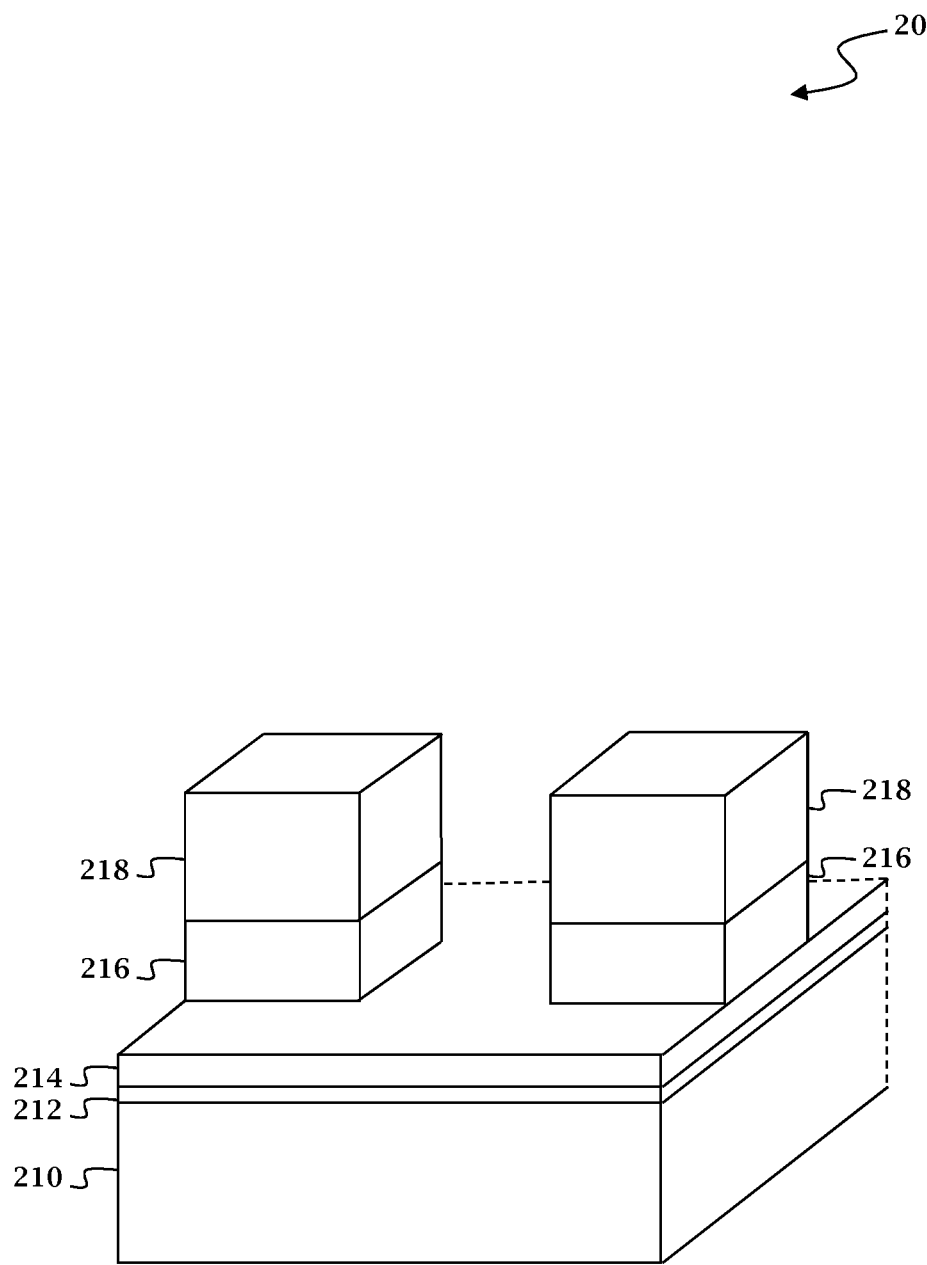
Figure 2N:
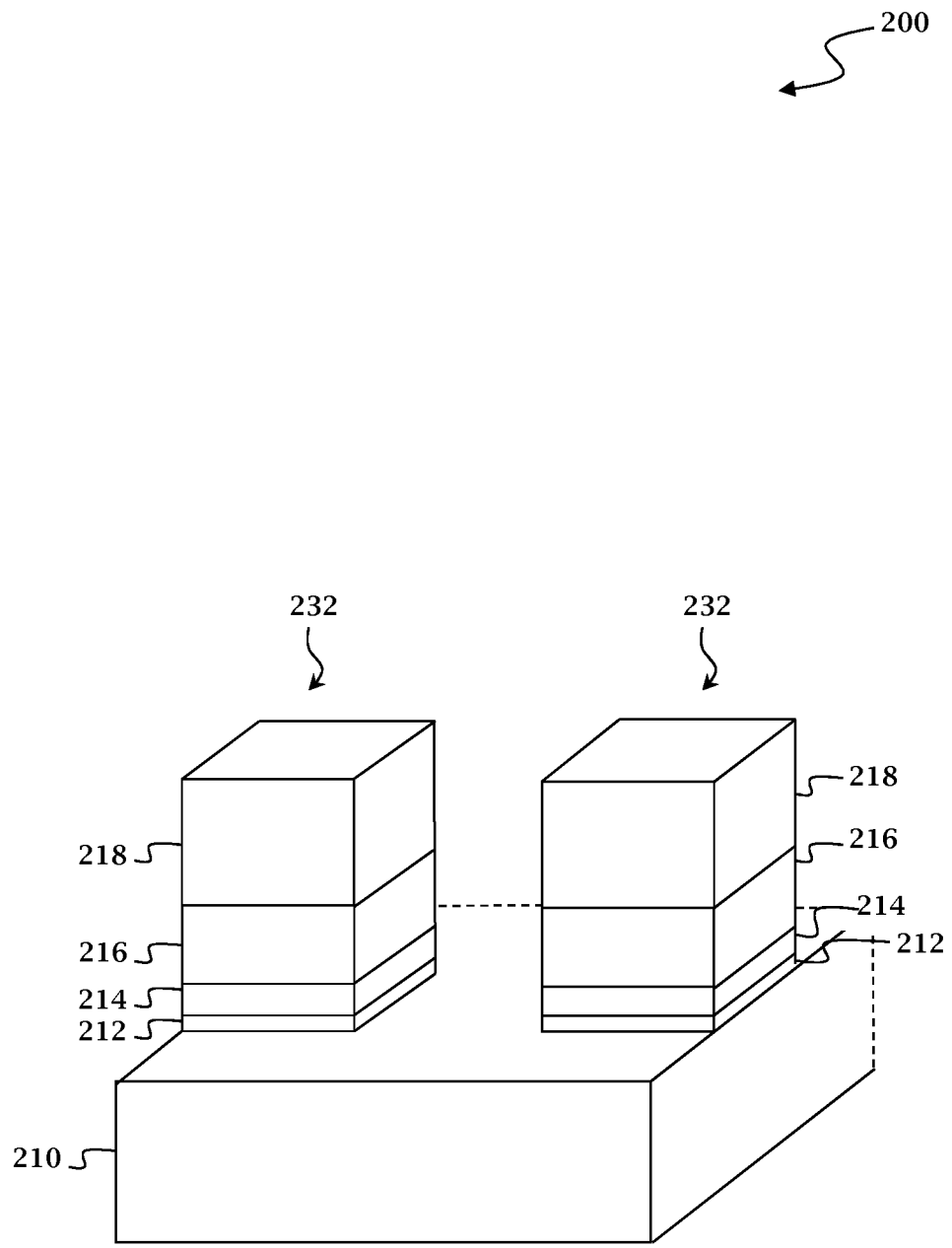

With reference to FIGS. 1 through 2N, a method 100 and a semiconductor device 200 are collectively described below. The semiconductor device 200 may be an integrated circuit, or portion thereof, that may comprise memory cells and/or logic circuits. The semiconductor device 200 may include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Referring to FIGS. 1 and 2A, the method 100 begins at step 102 wherein a substrate 210 is provided. A substrate includes a wafer, a semiconductor substrate, a mask (photomask or reticle, collectively referred to as mask), or any base material on which processing is conducted to produce layers of material, pattern features, and/or integrated circuits. In the present example, the substrate 210 is a semiconductor substrate comprising silicon. Alternatively, the semiconductor substrate 210 includes an elementary semiconductor including silicon or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure. Alternatively, the substrate 210 may include a non-semiconductor material, such as a glass substrate for thin-film-transistor liquid crystal display (TFT-LCD) devices, or fused quartz or calcium fluoride for a photomask (mask).

The substrate 210 may include various doped regions depending on design requirements as known in the art (e.g., p-type wells or n-type wells). The doped regions may be doped with p-type dopants, such as phosphorus or arsenic, and/or n-type dopants, such as boron or $BF_2$. The doped regions may be formed directly on the substrate 210, in a P-well structure, in a N-well structure, in a dual-well structure, or using a raised structure. The semiconductor substrate 210 may further include various active regions, such as regions configured for an N-type metal-oxide-semiconductor transistor device (referred to as an NMOS) and regions configured for a P-type metal-oxide-semiconductor transistor device (referred to as a PMOS). It is understood that the semiconductor device 200 may be formed by CMOS technology processing, and thus some processes are not described in detail herein.

The semiconductor device 200 may further include one or more isolation regions on the substrate 210 to isolate various regions of the substrate 210, for example, to isolate NMOS and PMOS device regions. The isolation regions may utilize isolation technology, such as local oxidation of silicon (LOCOS) or shallow trench isolation (STI), to define and electrically isolate the various regions. The isolation regions can comprise silicon oxide, silicon nitride, silicon oxynitride, other suitable materials, or combinations thereof. The isolation regions can be formed by any suitable process. As one example, the formation of an STI may include a photolithography process, etching a trench in the substrate (for example, by using a dry etching and/or wet etching process), and filling the trench (for example, by using a chemical vapor deposition process) with one or more dielectric materials. The filled trench may have a multi-layer structure such as a thermal oxide liner layer filled with silicon nitride or silicon oxide.

One or more material layers are formed over the substrate 210. The one or more material layers are formed over the substrate 210 by any suitable process, including various deposition techniques, such as physical vapor deposition (PVD), chemical vapor deposition (CVD), atomic layer deposition (ALD), plating, other suitable process, and/or combinations thereof. The one or more material layers may be patterned by various processing steps to form devices and/or features on the substrate 210. For example, the material layers may be patterned to form lines of gate structures (or gate stacks) for a semiconductor device.

The one or more material layers include any suitable layer including interfacial layers, dielectric layers, high-k dielectric layers, gate layers, conductive layers, capping layers, hard mask layers, buffer layers, diffusion/barrier layers, adhesion layers, and/or other suitable layers. In the present embodiment, the one or more material layers include layers for forming a high-k/metal gate structure. It is understood that the following exemplary embodiments, which form a high-k/metal gate structure, are not limiting, and that the processes described herein may be used to pattern other structures/features (or layers). In an example, a gate including a gate dielectric layer and polysilicon layer is formed. Other examples are contemplated.

Referring to FIG. 2A, a high-k dielectric layer 212, a gate layer 214, a capping layer 216, and a hard mask layer 218 are formed over the substrate 210. The material layers 212, 214, 216, 218 are patterned, as will be further discussed below, to form one or more gate structures over the substrate 210. Additional layers may be formed above and/or below the high-k dielectric layer 212, gate layer 214, capping layer 216, and/or hard mask layer 218, including liner layers, interface layers, seed layers, adhesion layers, barrier layers, etc. Though the present example illustrates the patterning of one or more gate structures, it is understood that the material layers may be patterned to form any desired feature.

The high-k dielectric layer 212 is formed over the substrate 210 by any suitable process to any suitable thickness. The high-k dielectric layer 212 includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof. Alternatively, the high-k dielectric layer 212 comprises a dielectric material, such as silicon oxide, silicon oxynitride, silicon nitride, other suitable dielectric materials, and/or combinations thereof.

The gate layer 214 is formed over the high-k dielectric layer 212 by any suitable process to any suitable thickness. The gate layer 214 may comprise a work function layer. The work function layer comprises any suitable material, such that the layer can be tuned to have a proper work function. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used. The work function layer may include doped conducting oxide materials. Alternatively, the gate layer 214 comprises other materials, such as aluminum, copper, titanium, tantalum, tantalum nitride, nickel silicide, cobalt silicide, TaC, TaSiN, metal alloys, other suitable materials, and/or combinations thereof. Further, the gate layer 214 may be doped polycrystalline silicon with the same or different doping.

The capping layer 216 is formed over the gate layer 214 by any suitable process. The capping layer 216 comprises polysilicon. Alternatively, the capping layer 216 comprises silicon-containing materials; germanium-containing materials; metal, such as aluminum, copper, tungsten, titanium, tantalum, titanium nitride, tantalum nitride, nickel silicide, and cobalt silicide; other proper conductive materials; and/or combinations thereof. The capping layer 216 comprises any suitable thickness. For example, the capping layer 216 may comprise a thickness of approximately 500 Å.

The hard mask layer 218 is formed over the gate layer 216 by any suitable process. The hard mask layer 218 comprises an oxide material, such as silicon oxide. Alternatively, the hard mask layer 218 comprises a nitrogen-containing material, such as silicon nitride, silicon oxynitride, other suitable nitrogen-containing materials, and/or combinations thereof. The hard mask layer may include an amorphous carbon material, silicon carbide, tetraethylorthosilicate (TEOS), other suitable materials, and/or combinations thereof. The hard mask layer 218 is formed to any suitable thickness. For example, the hard mask layer 218 comprises a thickness of approximately 850 Å.

The hard mask layer 218 is patterned by one or more conventional photolithography processes to form a protective hard mask that may be used to pattern underlying layers. The photolithography processes include forming a patterned imaging layer over the hard mask layer 218 and performing various etching and stripping processes to pattern the hard mask layer 218. For example, the hard mask layer 218 is patterned to define a protective hard mask particularly for patterning the capping layer 216 comprising polysilicon, and underlying gate layer 214 and high-k dielectric layer 212. Particularly, the hard mask layer 218 is patterned to define an end cut and a line cut for the underlying layers, resulting in a line of one or more gate structures.

Conventional processes institute a line-cut patterning process prior to an end-cut patterning process. However, it has been observed that such approaches provide less than desirable critical dimension uniformity (CDU) control, particularly as technology nodes continue to shrink to 32 nm and below. For example, a line-cut first approach may not guarantee that the critical dimension of subsequent wafers will be on target since the CD may be effected by subsequent end-cut patterning. Accordingly, the present example proposes an end-cut first approach. First, an end-cut patterning process is performed to define the ends of one or more gate structures. Then, a line-cut patterning process is performed to define gate lines of the one or more gate structures. The end-cut first approach provides improved CDU control.

It has been further observed that the end-cut first approach typically utilizes a single layer, such as an amorphous carbon layer, for line patterning, which sometimes leads to gate oxide punch-thru issues. Thus, in some embodiments, the proposed end-cut first approach utilizes a tri-layer patterning scheme for both the line-cut and end-cut patterning processes. The tri-layer patterning process, particularly when used for the line patterning process, provides tighter CD control. Further, because the tri-layer patterning process provides improved coverage of the layer being patterned, the tri-layer patterning process may improve (or eliminate) punch-thru issues that arise from utilizing a single patterning layer, such as the single amorphous carbon layer.

Referring to FIG. 1 and FIGS. 2A-2E, at step 104, an end-cut patterning process is performed. As shown in FIG. 2A, an imaging layer is formed over the hard mask layer 218 by any suitable process. The imaging layer can be a photoresist layer (also referred to as a resist layer, photosensitive layer, patterning layer, light sensitive layer, etc.) that is responsive to an exposure process for creating patterns. The imaging layer may be a positive-type or negative-type resist material and may have a multi-layer structure. One exemplary resist material is a chemical amplifier (CA) resist. In the present example, a tri-layer resist patterning scheme is utilized. Thus, the imaging layer includes three imaging layers—a bottom layer 220, a middle layer 222, and an upper layer 224. The bottom layer 220 is formed over the hard mask layer 218, the middle layer 222 is formed over the bottom layer 220, and the upper layer 224 is formed over the middle layer 222. Though the embodiment described herein utilizes a tri-layer patterning scheme for the end-cut process, it is understood that the end-cut patterning process may use other patterning layer schemes, such as a single imaging layer, so long as the imaging/patterning layer provides sufficient coverage of the surface topography of the imaging layer. For example, the end-cut approach may utilize an imaging layer comprising a photoresist layer and a thick bottom antireflective coating layer, such that the thick BARC layer sufficiently covers the surface of the hard mask layer. In another example, the end-cut approach may utilizes a thick single layer, such as a thick silicon oxynitride (SiON) layer or an amorphous carbon layer.

The bottom, middle, and upper layers 220, 222, 224 comprise any suitable material. For example, the layers 220, 222, 224 may comprise various organic and/or inorganic materials. In one example, bottom layer 220 comprises an organic layer, middle layer 222 comprises an inorganic layer, and upper layer 224 comprises an organic layer. The bottom organic layer may comprise a photoresist material, an anti-reflective coating (ARC) material, a polymer material, and/or other suitable materials. The middle inorganic layer may comprise an oxide layer, such as a low temperature CVD oxide, an oxide derived from TEOS (tetraethylorthosilicate), silicon oxide, or silane oxide. Another example includes the middle layer as a Si-containing anti-reflective coating (ARC) material, such as a 42% Si-containing ARC layer. The upper organic layer may comprise an organic photoresist material. Further, the imaging layers 220, 222, 224 comprise any suitable thickness. In one example, the bottom layer 220 comprises a thickness of approximately 2000 Å, the middle layer 222 comprises a thickness of approximately 480 Å, and the upper layer 224 comprises a thickness of approximately 750 Å.

Utilizing the tri-layer patterning technique, first, the upper, photoresist layer 224 is patterned by a photolithography process and/or processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. Referring to FIG. 2B, the photolithography process includes exposing one or more portions of the upper layer 224 while protecting one or more other portions of the upper layer 224. In the present example, the upper layer 224 is a negative resist, and thus, the exposed portions 224A become insoluble upon exposure, while the unexposed portions 224B remain soluble. The patterning of the photoresist layer 224 can use one or more masks to form the one or more exposed and unexposed portions 224A, 224B. The photolithography exposing process may also be implemented or replaced by other proper methods such as maskless photolithography, electron-beam writing, ion-beam writing, and molecular imprint. Further, the photolithography patterning and exposing process may implement krypton fluoride (KrF) excimer lasers, argon fluoride (ArF) excimer lasers, immersion lithography, ultraviolet radiation, extreme ultraviolet (EUV) radiation, and/or combinations thereof.

Referring to FIG. 2C, portions of the upper layer 224 are removed to form one or more openings. For example, the unexposed portions 224B of the upper layer 224 are removed to form a pattern having one or more first openings 225A. The unexposed portions 224B are removed by any suitable process. The resulting upper layer pattern defines an end-cut for the one or more gate structures to be fabricated. The pattern of the upper layer 224 is then transferred to the underlying layers. For example, as illustrated in FIG. 2D, the one or more first openings 225A are transferred to the middle layer 222, bottom layer 220, and hard mask layer 218, forming one or more second openings 225B substantially equal to the one or more first openings 225A. Second openings 225B are formed by any suitable process. For example, one or more etching process may be utilized, including various dry etching, wet etching, and/or other etching methods (e.g., reactive ion etching). Subsequently, the remaining upper, middle, and bottom layers 220, 222, 224 are removed by any suitable process, including a photoresist stripping process. It is understood that the upper layer 224, middle layer 222, and bottom layer 220 may be simultaneously or independently removed. For example, while transferring opening 225A to the middle layer 222, the upper layer 224 may be simultaneously removed; while transferring the opening 225A to the bottom layer 220, the middle layer 222 may be simultaneously removed; and while transferring the opening 225B to hard mask layer 218, the bottom layer 220 may be simultaneously removed, resulting in a step-by-step removal of the tri-layer resist. Other processes are contemplated.

The remaining hard mask layer 218 forms a protective mask with one or more openings 225C, substantially similar to openings 225A, 225B. The protective mask defines an end-cut for the capping layer 216. After the end-cut patterning process, referring to FIG. 1 and FIGS. 2F-2L, at step 106, a line-cut patterning process is performed. Similarly to FIGS. 2A-2E, a tri-layer patterning technique is utilized, and thus, an imaging layer that includes three imaging layers is formed over the hard mask layer 218—a bottom layer 226, a middle layer 228, and an upper layer 230 as shown in FIG. 2F. The bottom layer fills in the one or more openings 225C. The upper layer 230, middle layer 228, and bottom layer 226 are similar to the upper layer 224, middle layer 222, and bottom layer 220, respectively. Utilizing the tri-layer patterning technique for the line-cut patterning process provides improved critical dimension profile control. It is understood that, similarly to the end-cut patterning process, other patterning schemes are contemplated, and the line-cut patterning process is not limited to utilizing the tri-layer pattering technique.

The upper, photoresist layer 230 is patterned by a photolithography process and/or processes. The photolithography process includes exposing one or more portions of the upper layer 230 while protecting one or more other portions of the upper layer 230. In the present example, the upper layer 230 is a negative resist, and thus, the exposed portions 230A become insoluble upon exposure, while the unexposed portions 230B remain soluble as illustrated in FIG. 2G. The patterning of the upper layer 230 can use one or more masks to form the one or more exposed and unexposed portions 230A, 230B. The photolithography exposing process may also be implemented or replaced by other proper methods such as maskless photolithography, electron-beam writing, ion-beam writing, and molecular imprint. Further, the photolithography patterning and exposing process may implement krypton fluoride (KrF) excimer lasers, argon fluoride (ArF) excimer lasers, immersion lithography, ultraviolet radiation, extreme ultraviolet (EUV) radiation, and/or combinations thereof.

Referring to FIG. 2H, portions of the upper layer 230 are removed to form one or more openings. For example, the unexposed portions 230B of the upper layer 230 are removed to form one or more line openings. The patterned upper layer 230 defines a line-cut for the one or more gate structures to be fabricated. The pattern of the upper layer 230 is then transferred to the underlying layers by a tri-layer etching process. For example, as illustrated in FIG. 2I, the line pattern 230A is transferred to the middle layer 228 and bottom layer 226. One or more etching processes may be utilized, including various dry etching, wet etching, and/or other etching methods (e.g., reactive ion etching), to remove the unprotected portions of the middle and bottom layers 228, 226 until the hard mask layer 218 is reached, which leaves portions of the bottom layer 226 within the openings 225C. Subsequently, referring to FIG. 2J, the exposed portions 230A of upper layer 230 are removed by any suitable process, including a photoresist stripping process. Alternatively, the exposed portions 230A of upper layer 230 are simultaneously removed during removal of the imaging layers 226, 228, for example, during removal of the bottom layer 228.

Referring to FIG. 2K, the line pattern is then transferred to the hard mask layer 218. The middle layer 228 and bottom layer 226 act as a mask for protecting portions of the hard mask layer 218. The unprotected portions of the hard mask layer 218 are removed by one or more etching processes, including various dry etching, wet etching, and/or other etching methods (e.g., reactive ion etching). The etching process may continue until the capping layer 216 is reached. During the hard mask layer etching process, the middle layer 228 may be simultaneously removed, along with a portion of the bottom layer 226, as illustrated in FIG. 2K. It is understood that the etching process may utilize an etching solution with a low selectivity to the bottom layer 226, such that portions of the bottom layer remain during the hard mask layer etching process, which allows fine-tuning of the resulting protective mask profile angle.

Then, the remaining bottom layer 226 is removed by an ashing process or other suitable process. The remaining hard mask layer 218 defines a protective mask for forming one or more gate structures as shown in FIG. 2L. Portions of the capping layer 216, gate layer 214, and high-k dielectric layer 212 underlying the hard mask layer 218 will be protected during subsequent processing. Referring to FIGS. 2M and 2N, one or more etching processes are performed to remove unprotected portions of the capping layer 216, gate layer 214, and high-k dielectric layer 212. The etching processes may include various dry etching, wet etching, and/or other etching methods (e.g., reactive ion etching). For example, removing the capping layer 216, gate layer 214, and high-k dielectric layer 212 may comprise a wet-dry-wet etching combination. A dry etching process may be implemented in an etching chamber using process parameters including a radio frequency (RF) or microwave source power, a bias power, a pressure, a flow rate, a wafer temperature, other suitable process parameters, and/or combinations thereof. The dry etching process may implement an oxygen-containing gas, fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof. A wet etching process may utilize a hydrofluoric acid (HF) solution for a HF dipping process and/or a dilute APM process with an adequate ratio of $NH_4OH:H_2O_2:H_2O$ solution. The HF or APM solution may have any suitable concentration (e.g., 1:100 for an HF solution or 1:6:25 for an APM solution) at a suitable temperature (e.g., elevated or room temperature). The wet etching process may alternatively apply a diluted hydrofluoric acid (DHF) to the semiconductor device 200. It is understood that removing unprotected portions of the capping layer 216, gate layer 214, and high-k dielectric layer 212 may include multiple etching steps and etching solutions (with an APM solution, etc.).

The patterning process of method 100 results in semiconductor device 200 having a line of one or more gate structures as shown in FIG. 2N. The gate structures (gate stacks) comprise hard mask layer 218, capping layer 216, gate layer 214, and high-k dielectric layer 212. Though only one gate line appears, multiple gate lines are contemplated. It is understood that the semiconductor device 200 may then undergo further CMOS or MOS technology processing to form various features known in the art. For example, gate sidewall spacers may be formed on sides of the gate stacks by a deposition and etching process; lightly doped regions (referred to as LDD regions) may be formed in the substrate 210 using any suitable process, such as ion implantation, and any suitable dopants; and source and drain regions (referred to as S/D regions) may be formed in the substrate 210 using ion implantation or diffusion with suitable dopants and located proximate to each end of the gate stacks. Further, subsequent processing may form various contacts/vias/lines and multilayer interconnect features (e.g., metal layers and interlayer dielectrics) on the substrate 210, configured to connect the various features or structures of the semiconductor device 200. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a multilayer interconnection structure.

Figure 3:
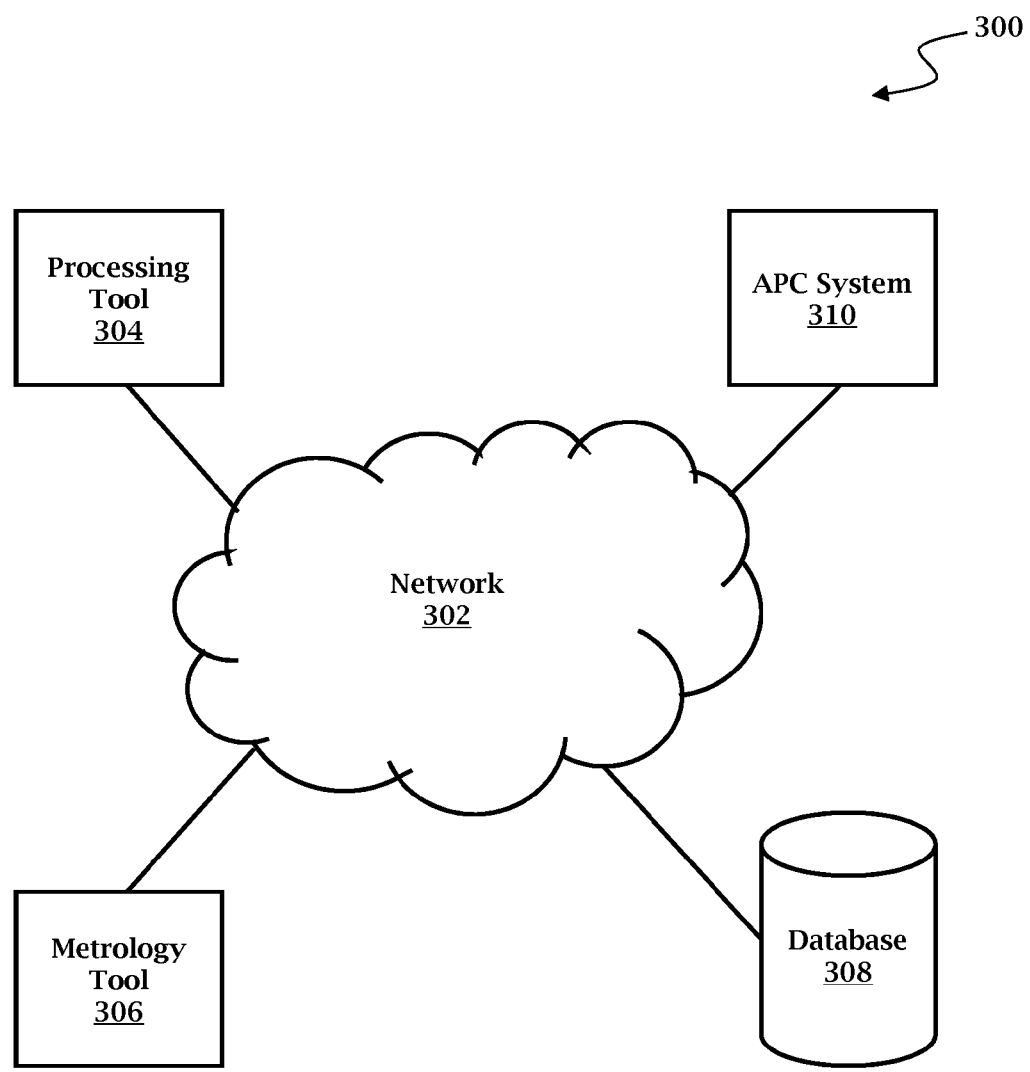
FIG. 3 is a block diagram illustrating an integrated circuit device fabrication system in which various embodiments disclosed herein are implemented.

Referring to FIG. 3, an integrated circuit manufacturing system 300 is illustrated. The system 300 comprises a plurality of entities that are connected by a communications network 302. The system 300 may implement a semiconductor manufacturing process that fabricates a plurality of substrates (or wafers). In the present embodiment, a gate stack formation process is performed by the system 300, such as the process described in FIGS. 1 and 2A-2N. The network 302 may be a single network or may be a variety of different networks, such as an intranet and the Internet, and may include both wired and wireless communication channels. Each entity may interact with other entities and may provide services to and/or receive services from the other entities. The entities include one or more processing tools 304, metrology tools 306, databases 308, and Advanced Process Control (APC) systems 310. It is understood that the system 300 may further comprise various processing tools (e.g., deposition tools, annealing tools, etching tools, electroplating tools, furnaces, etc.), metrology equipment, and controllers that perform other stages of integrated circuit device fabrication but are not illustrated for the sake of simplicity and clarity.

The processing tool 304 may comprise one or more tools, such as a deposition tool, an annealing tool, an exposure tool, a baking tool, and an etching tool. A semiconductor wafer may be placed into the processing tool 304 and subjected to various processes, including deposition, baking, and etching processes. The processing tool 304 may implement any suitable processes, including processes described herein. In an example, in a single processing tool 304, multiple processes may be performed to form various features that form an integrated circuit. For example, the processing tool 304 may in situ form a gate stack over a substrate by performing deposition, patterning, and etching processes. Alternatively, the system 300 comprises a separate processing tool 304 for each process. The process tool 304 may further include a plurality of sensors for monitoring pressure, gas flows, time, temperature, impurity levels, and/or other parameters.

The metrology tool 306 comprises any type of metrology tool. The metrology tool 306 measures various characteristics (and/or details) of the integrated circuit device as it is being fabricated. The measurement data may include wafer results, such as wafer parameters measured by the metrology tool 306 including sheet resistance, reflectivity, stress, particle density, and critical dimension. In the present embodiment, the metrology tool measures a critical dimension of a pattern after various processes, such as after a development and/or etching process. The metrology tool 306 may also measure a thickness of the material layer after a process. The metrology tool 306 may classify defects and features of the product being manufactured. The metrology tool 306 may include electrical, optical, and/or analytical tools, such as microscopes (e.g., scanning electron microscopes and/or optical microscopes), micro-analytical tools, line width measurement tools, mask and reticle defect tools, particle distribution tools, surface analysis tools, stress analysis tools, resistivity and contact resistance measurement tools, mobility and carrier concentration measurement tools, junction depth measurement tools, film thickness tools, gate oxide integrity test tools, C-V measurement tools, focused ion beam (FIB), laser surface defect scanners, residual gas analyzers, process tool particle counters, and/or a variety of other metrology tools. In an example, the metrology tool comprises an after development inspection (ADI) metrology tool and/or an after etching inspection (AEI) metrology tool.

The metrology tool 306 can send the measurement data to the database 308 for storing. The measurement data may be directly provided to the APC system 310. The database can include a tool database, a configuration database, and/or a cross-tool analysis database. The configuration database stores configuration information, process control models, and process control strategies for the process tool 304. For example, the configuration information may be used to adjust a process parameter such as gas flow, chamber pressure, and/ or process time. Optimizations and other adjustments may be made to the process tool 304 via the network 302. The cross-tool analysis database includes information obtained from multiple process tools 304. Such information may be used to analyze the performance, yield rate, and other data of each process tool with that of the other process tools. It is understood that aspects of the present disclosure may be implemented within the APC system 310 to analyze information either from the metrology tools 306 or the database 308 or other proper equipment in the system 300.

The APC system 310 controls various processes within the system 300. The APC system 310 can manage, perform, and/or control a material process flow, such as a material process flow 400 illustrated in FIG. 4. The material process flow 400 implements an end-cut first approach when forming one or more features over a substrate, such as a plurality of gate structures. The end-cut first approach provides improved control over critical dimension uniformity, particularly when manufacturing a plurality of wafers (or substrates). Block 402A represents an end-cut patterning process, and block 402B represents a line-cut patterning process. The material process flow 400 illustrates four processes: a first patterning process 404A, a first cut process 404B, a second patterning process 404C, and a second cut process 404D. The first, second patterning and cutting processes 404A, 404B, 404C, 404D may fabricate one or more gate stacks on a wafer, such as the processes described with reference to FIGS. 1 and 2A-2N. The first patterning and cut processes 404A, 404B may implement the end-cut patterning process described in FIGS. 2A-2E. The second patterning and cut processes 404C, 404D may implement the end-cut patterning process described in FIGS. 2F-2L.

For example, a first substrate having one or more material layers (e.g., a high-k dielectric layer, gate layer (e.g., polysilicon layer and/or metal layer), and a hard mask layer) disposed thereover is provided. The first patterning process 404A includes depositing a first imaging layer over the material layer, exposing the first imaging layer, and developing the first imaging layer to provide a patterned first imaging layer over the material layer. The patterned first imaging layer defines an end-cut pattern, which is transferred to the underlying material layer by the first cut process 404B. One or more etching processes may be utilized for the first cut process 404B. Then, the second patterning process 404C is performed. The second patterning process 404C can include depositing a second imaging layer over the material layer, exposing the second imaging layer, and developing the second imaging layer to provide a second patterned imaging layer over the material layer. The patterned second imaging layer defines a line-cut pattern, which is transferred to the underlying material layer by the second cut process 404D. One or more etching processes may be utilized for the second cut process 404D.

Figure 4:
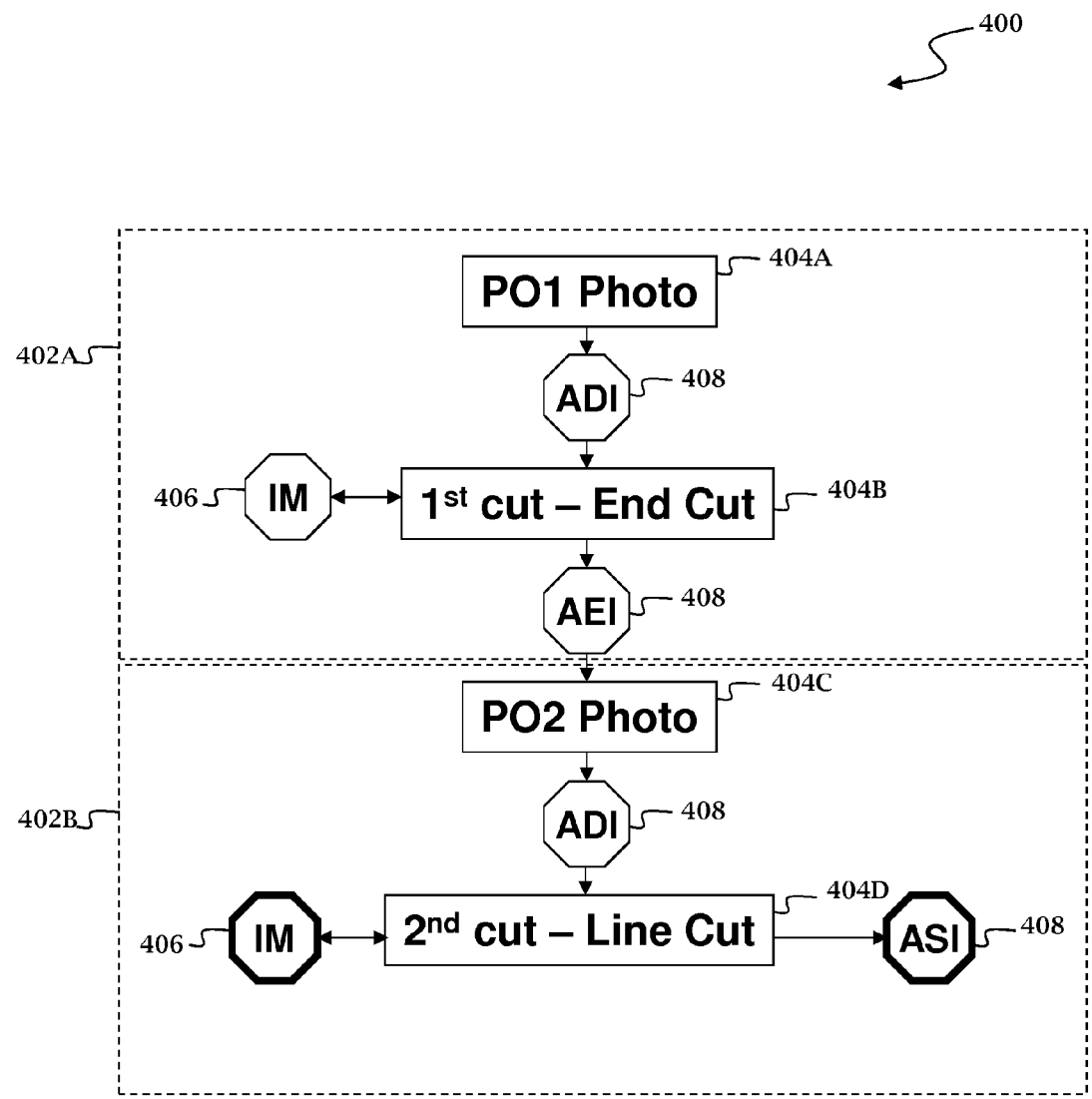
FIG. 4 is a block diagram of a material process flow according to aspects of the present embodiments.

As illustrated in FIG. 4, an integrated metrology tool 406 is in communication with the first and second cut processes 404B, 404D. The integrated metrology tool 406 is similar to the metrology tools described above, and it may include a single metrology tool or multiple metrology tools. The integrated metrology tool 406 may also be in communication with the processes 404A, 404C and/or measurement processes 408. As evident from FIG. 4, at various points within the material process flow 400, measurement processes 408 are performed on the fabricated wafers. The measurement processes 408 may be controlled or performed by the integrated metrology tool 406, process tools 304, metrology tools 306, the APC system 310 itself, and/or a combination thereof.

The measurement processes 408 include one or more after development inspections (ADI), after etching inspections (AEI), after stripping inspections (ASI), and/or other suitable inspections. The measurement processes 408 obtain any suitable measurements, for example, wafer parameters including thickness, grain size, critical dimension, other suitable parameters, and/or combinations thereof. In the present embodiment, the measurement processes 408 monitor a critical dimension of the resulting patterns.

During the material process flow 400, the process tools 304, metrology tools 306 (e.g., integrated metrology tool 406), databases 308, and APC system 310 exchange information. The exchange of information concerning the material process flow 400 facilitates CDU control. This information exchange includes the exchange of feedback data and feed-forward data. A communication may include both feedback and feed-forward data. The feed-forward data may be used to set wafer specific process parameters and/or process targets for subsequent processing of a wafer. For example, feed-forward data includes measurement data associated with a first wafer being processed that is used to determine subsequent process parameters and/or targets for the first wafer. The feedback data may be used to determine process parameters and/or process targets for the processing of subsequent wafers. For example, feedback data includes measurement data associated with the first wafer that is used to determine process parameters and/or targets for a second wafer.

In particular, in the present embodiment, utilizing feed-forward and/or feedback data received from the material process flow 400, the metrology tools 406 in communication with the first and second cut processes 404B, 404D can periodically update models used to determine the patterning and/or etching process parameters. The feed-forward and feed-back data can include measurement data from the ADI, AEI, ASI measurement processes 408. If the etched feature is a gate stack, measurement data fed forward or back may include critical dimension and/or side wall angle measurements of the gate stack. The process tools 304, metrology tools 306, and/or APC system 310 utilize the fed-forward and fed-back measurement data to determine a wafer specific process target for subsequent processes on a first wafer or a subsequent wafer. For example, the APC system 310 may utilize a critical dimension from the ADI measurements to determine if the subsequent cutting/etching processes should be modified to obtain a desired target. The APC system 310 may utilize the critical dimension from the ASI/AEI measurements to determine if patterning or cutting/etching processes should be modified to obtain a desired target for a subsequently processed wafer. The ability to feedback any shift from desired targets allows immediate adjustment of the process parameters for a subsequently processed wafer, ensuring that the subsequently processed wafer exhibits the desired targets.

In summary, an end-cut first approach may be implemented to form an integrated circuit device having one or more gate structures. The disclosed method provides improved critical dimension uniformity (CDU). The improved CDU may be achieved by utilizing a tri-layer patterning technique for forming either a line-cut and/or an end-cut. The tri-layer patterning technique can prevent void and gate oxide punch-through issues. Further, CD measurements obtained for a wafer after a first end cut process may be fed back to determine any CD shift. If a CD shift exists, proper adjustments for processing parameters may be immediately changed for subsequently processed wafers. It is understood that different embodiments may have different advantages, and that no particular advantage is necessarily required of all embodiments. It is further understood that the end-cut first approach may be applied to any suitable patterning process. For example, the end-cut first approach may be applied to metal line patterning, active region (OD layer) patterning, etc.

The present disclosure can be implemented in an entirely hardware embodiment, an entirely software embodiment, or an embodiment containing both hardware and software elements. Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, the method comprising:
    providing a substrate having a material layer formed over the substrate and a hard mask layer formed over the material layer, wherein the material layer includes a gate conductor and a capping layer disposed on the gate conductor;
    performing an end-cut process to form an end-cut pattern in the hard mask layer, wherein the end-cut pattern defines a set of line-end surfaces of the hard mask layer extending in a first direction;
    thereafter, performing a line-cut process to form a line-cut pattern in the hard mask layer;
    performing a first etching process on the substrate to transfer the end-cut pattern and the line-cut pattern concurrently from the hard mask layer to the capping layer of the material layer; and
    performing a second etching process to transfer the end-cut pattern and the line-cut pattern from the capping layer to the gate conductor.

2. The method of claim 1, wherein the substrate includes a first imaging layer formed over the hard mask layer, and wherein the performing of the end-cut process further forms an end-cut pattern in the first imaging layer and transfers the end-cut pattern in the first imaging layer to the hard mask layer to form the end-cut pattern in the hard mask layer.

3. The method of claim 2 further comprising:
    after the performing of the end-cut process, forming a second imaging layer over the hard mask layer such that a portion of the second imaging layer is disposed within an opening in the hard mask layer.

4. The method of claim 3, wherein the performing of the line-cut process further forms a line-cut pattern in the second imaging layer and transfers the line-cut pattern in the second imaging layer to the hard mask layer to form the line-cut pattern in the hard mask layer.

5. The method of claim 4, wherein each of the first imaging layer and the second imaging layer includes three imaging layers.

6. The method of claim 5, wherein the each of the forming of the end-cut pattern in the first imaging layer and the forming of the line-cut pattern in the second imaging layer includes a tri-layer patterning technique.

7. The method of claim 1, wherein the material layer further includes a dielectric layer disposed between the gate conductor and the substrate.

8. The method of claim 1, wherein the providing of the substrate includes forming the material layer over the substrate and forming the hard mask layer over the material layer.

9. A method for fabricating a semiconductor device, the method comprising:
    providing a substrate;
    forming a material layer over the substrate, wherein the material layer includes a capping layer and a gate electrode disposed between the capping layer and the substrate;
    forming a hard mask layer over the material layer;
    performing an end-cut process to define an end of a gate structure, wherein the performing of the end-cut process patterns the hard mask layer to form a set of end surfaces of the hard mask layer oriented in a first direction;
    thereafter, performing a line-cut process to define a line edge of the gate structure, wherein the performing of the line-cut process patterns the hard mask layer;
    transferring a pattern formed in the hard mask layer by the end-cut process and the line-cut process to the capping layer of the material layer after the end-cut process and the line-cut process; and
    transferring the pattern formed in the capping layer to the gate electrode.

10. The method of claim 9 further comprising forming a first imaging layer over the hard mask layer, and wherein the performing of the end-cut process includes patterning the first imaging layer and transferring a pattern formed in the first imaging layer to the hard mask layer.

11. The method of claim 10 further comprising forming a second imaging layer over the hard mask layer and within a pattern formed in the hard mask layer by the performing of the end-cut process.

12. The method of claim 11, wherein the performing of the line-cut process includes patterning the second imaging layer and transferring a pattern formed in the second imaging layer to the hard mask layer.

13. The method of claim 12, wherein at least one of the first imaging layer and the second imaging layer includes three imaging layers.

14. The method of claim 13, wherein at least one of the end-cut patterning and the line-cut patterning includes a tri-layer patterning technique.

15. The method of claim 9, wherein the material layer further includes a dielectric layer disposed between the gate electrode and the substrate.

16. A method for fabricating a semiconductor device, the method comprising:
    providing a substrate having a gate conductor disposed over the substrate, a capping layer disposed over the gate conductor, and a hard mask layer disposed over the capping layer;
    performing an end-cut process on the substrate to define an end of a gate structure, wherein the performing of the end-cut process patterns the hard mask layer to define an end surface of the hard mask layer in a first orientation;

measuring a first performance parameter of the substrate corresponding to the end-cut process;

performing a line-cut process on the substrate to define a line edge of the gate structure, wherein the performing of the line-cut process patterns the hard mask layer;

measuring a second performance parameter of the substrate corresponding to the line-cut process;

transferring a pattern formed in the hard mask layer by the end-cut process and the line-cut process to the capping layer;

transferring the pattern from the capping layer to the gate conductor; and determining a modification to a process performed on at least one of the substrate and another substrate based on at least one of the first performance parameter and the second performance parameter.

17. The method of claim 16 further comprising, based on the determination, modifying the line-cut process performed on the substrate based on the first performance parameter measured after the end-cut process performed on the substrate.

18. The method of claim 16, wherein the measuring of the first performance parameter and the measuring of the second performance parameter includes at least one of an after development inspection (ADI), an after etching inspection (AEI), and an after stripping inspection (ASI).

19. The method of claim 16, wherein at least one of the first performance parameter and the second performance parameter includes at least one of a critical dimension measurement and a side wall measurement.

20. The method of claim 16, wherein the determining of the modification includes comparing the at least one of the first performance parameter and the second performance parameter to a target.

* * * * *